(12) United States Patent
Kang et al.

(10) Patent No.: US 11,171,017 B2
(45) Date of Patent: Nov. 9, 2021

(54) SHUTTER DISK

(71) Applicant: Applied Materials, Inc., Santa Clara, CA (US)

(72) Inventors: Zhang Kang, Singapore (SG); Junqi Wei, Singapore (SG); Yueh Sheng Ow, Singapore (SG); Kelvin Boh, Singapore (SG); Yuichi Wada, Chiba (JP); Ananthkrishna Jupudi, Singapore (SG); Sarath Babu, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/010,961

(22) Filed: Sep. 3, 2020

(65) Prior Publication Data
US 2021/0074552 A1    Mar. 11, 2021

Related U.S. Application Data

(60) Provisional application No. 62/896,819, filed on Sep. 6, 2019.

(51) Int. Cl.
| | |
|---|---|
| *H01L 21/48* | (2006.01) |
| *H01L 21/322* | (2006.01) |
| *H01L 21/02* | (2006.01) |
| *H01L 23/00* | (2006.01) |
| *H01L 21/768* | (2006.01) |
| *H01L 21/67* | (2006.01) |
| *H01L 21/50* | (2006.01) |
| *H01L 21/60* | (2006.01) |

(52) U.S. Cl.
CPC .... *H01L 21/4853* (2013.01); *H01L 21/02043* (2013.01); *H01L 21/322* (2013.01); *H01L 21/50* (2013.01); *H01L 21/67011* (2013.01); *H01L 21/76841* (2013.01); *H01L 24/11* (2013.01); *H01L 24/94* (2013.01); *H01L 2021/60052* (2013.01)

(58) Field of Classification Search
None
See application file for complete search history.

(56) References Cited

U.S. PATENT DOCUMENTS

| | | | |
|---|---|---|---|
| 4,062,319 A | * | 12/1977 | Roth ................. C23C 14/505 118/733 |
| 5,961,791 A | | 10/1999 | Frisa et al. |
| 6,222,279 B1 | | 4/2001 | Mis et al. |
| 8,786,081 B2 | | 7/2014 | Chen |

(Continued)

FOREIGN PATENT DOCUMENTS

KR    20070043820 A    4/2007

OTHER PUBLICATIONS

PCT International Search Report and Written Opinion in PCT/US2020/049184 dated Oct. 18, 2020, 11 pages.

*Primary Examiner* — Alexander G Ghyka
(74) *Attorney, Agent, or Firm* — Servilla Whitney LLC

(57) ABSTRACT

Describes are shutter disks comprising one or more of titanium (Ti), barium (Ba), or cerium (Ce) for physical vapor deposition (PVD) that allows pasting to minimize outgassing and control defects during etching of a substrate. The shutter disks incorporate getter materials that are highly selective to reactive gas molecules, including $O_2$, CO, $CO_2$, and water.

12 Claims, 5 Drawing Sheets

(56) References Cited

U.S. PATENT DOCUMENTS

| | | |
|---|---|---|
| 2004/0040855 A1 | 3/2004 | Batinovich et al. |
| 2008/0017220 A1 | 1/2008 | Kodera et al. |
| 2012/0132522 A1 | 5/2012 | Foster et al. |
| 2014/0020629 A1* | 1/2014 | Tsai .................. H01J 37/34 118/728 |
| 2016/0118280 A1 | 4/2016 | Wood et al. |
| 2019/0172716 A1* | 6/2019 | Graoui .............. H01L 21/02186 |
| 2019/0272980 A1 | 9/2019 | Burgess et al. |

* cited by examiner

SHUTTER DISK

CROSS-REFERENCE TO RELATED APPLICATIONS

This application claims priority to U.S. Provisional Application Ser. No. 62/896,819, filed Sep. 6, 2019, the entire disclosure of which is hereby incorporated by reference herein.

TECHNICAL FIELD

Embodiments of the present disclosure generally relate to electronic devices. More particularly, embodiments of the present disclosure relate to under bump metallization in a wafer-level or flip-chip package.

BACKGROUND

Over the course of semiconductor fabrication evolution, different packaging technologies have been implemented. Wafer-level manufacturing and flip-chip packaging technologies for electronic devices are at the forefront of miniaturization solutions.

The goal of semiconductor packaging is to achieve shorter electron pathways for increased speed, lower power, better device functionality, and lower cost. Under bump metallization (UBM) is required for connecting a die to the substrate with solder bumps for flip-chip packages. The UBM of the integrated circuit (IC) bonds pads that are typically aluminum or copper. This is an essential process step for the reliability of the electronic package.

Several options are available to achieve under bump metallization (UBM). The dry vacuum sputter method combined with electroplating is the most common method used and involves multiple metal layers sputtered in a high temperature evaporation system. The final layer of many IC bond pads typically includes aluminum, aluminum/silicon, aluminum/silicon/copper, or copper. Aluminum is suitable for conventional wire bonding interconnects since the wire bonding techniques form acceptable connections through the oxide layer normally present. Aluminum, however, is not solderable, wettable, or bondable to the bump and soldering materials used in reflow. The UBM layer produces a good bond to the aluminum pad, hermetically seals the aluminum, and prevents the potential of diffusion of metals into the IC package.

Aluminum oxidizes almost immediately when it is exposed to the environment, so the first challenge in UBM processing is to remove the native oxide layer from the aluminum IC pad. Thus, in UBM processes, a pre-clean step is necessary to remove native oxide of metal contact pads prior to the deposition of barrier layers. During the pre-clean process, however, outgassing molecules and species will be generated and, thus, re-contaminate the clean metal surface and cause high contact resistance that will affect integrated circuit performance.

Accordingly, there is a need for improved under bump metallization methods for flip-chip and wafer level packaging.

SUMMARY

One or more embodiments of the disclosure are directed to a processing method. The method comprises depositing a thickness of a getter material on walls of a processing chamber; and etching a substrate with a plasma in the processing chamber to remove native oxides and form a cleaned substrate, wherein etching the substrate releases outgassing molecules which are chemically bound to the getter material.

Additional embodiments of the disclosure are directed to processing tools. A processing tool comprises: a pre-clean chamber having a substrate support therein; a buffer station; a robot configured to access the pre-clean chamber and the buffer station; and a controller connected to the pre-clean chamber, the buffer station and the robot, the controller having one or more configurations selected from: depositing a getter material, etching a substrate, or depositing a barrier layer.

Further embodiments of the disclosure are directed to a non-transitory computer readable medium including instructions, that, when executed by a controller of a processing chamber, causes the processing chamber to perform operations of: depositing a getter material on the walls of the processing chamber; and etching a substrate with a plasma in the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
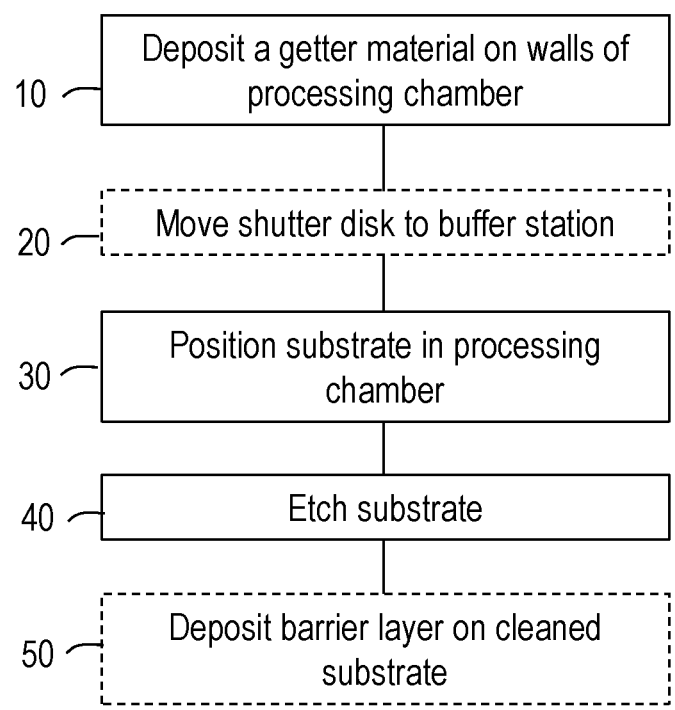
FIG. 1 depicts a flow diagram of a processing method in accordance with one or more embodiments.
Figure 2:
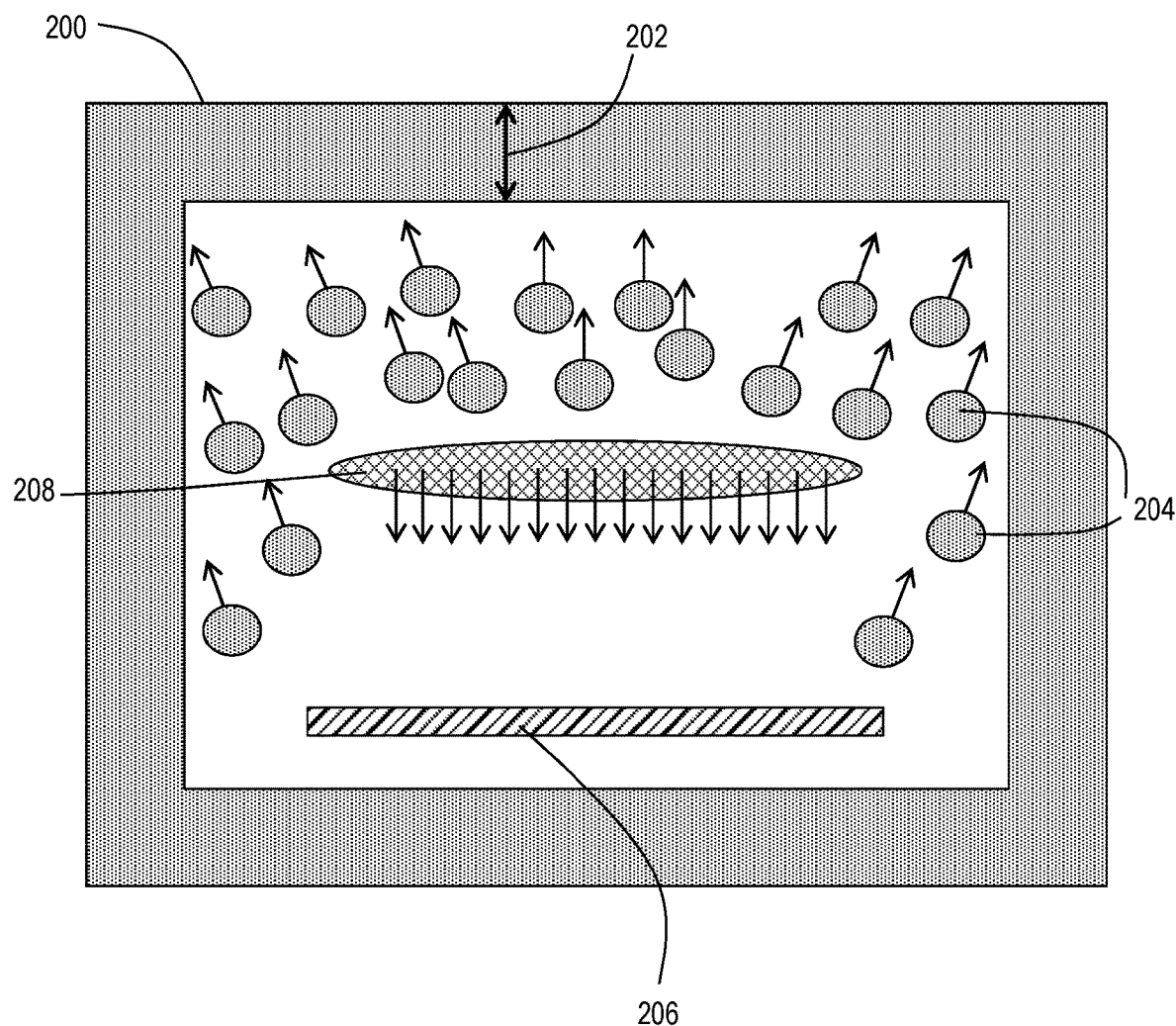
FIG. 2 depicts a processing chamber in accordance with one or more embodiments.
Figure 3:
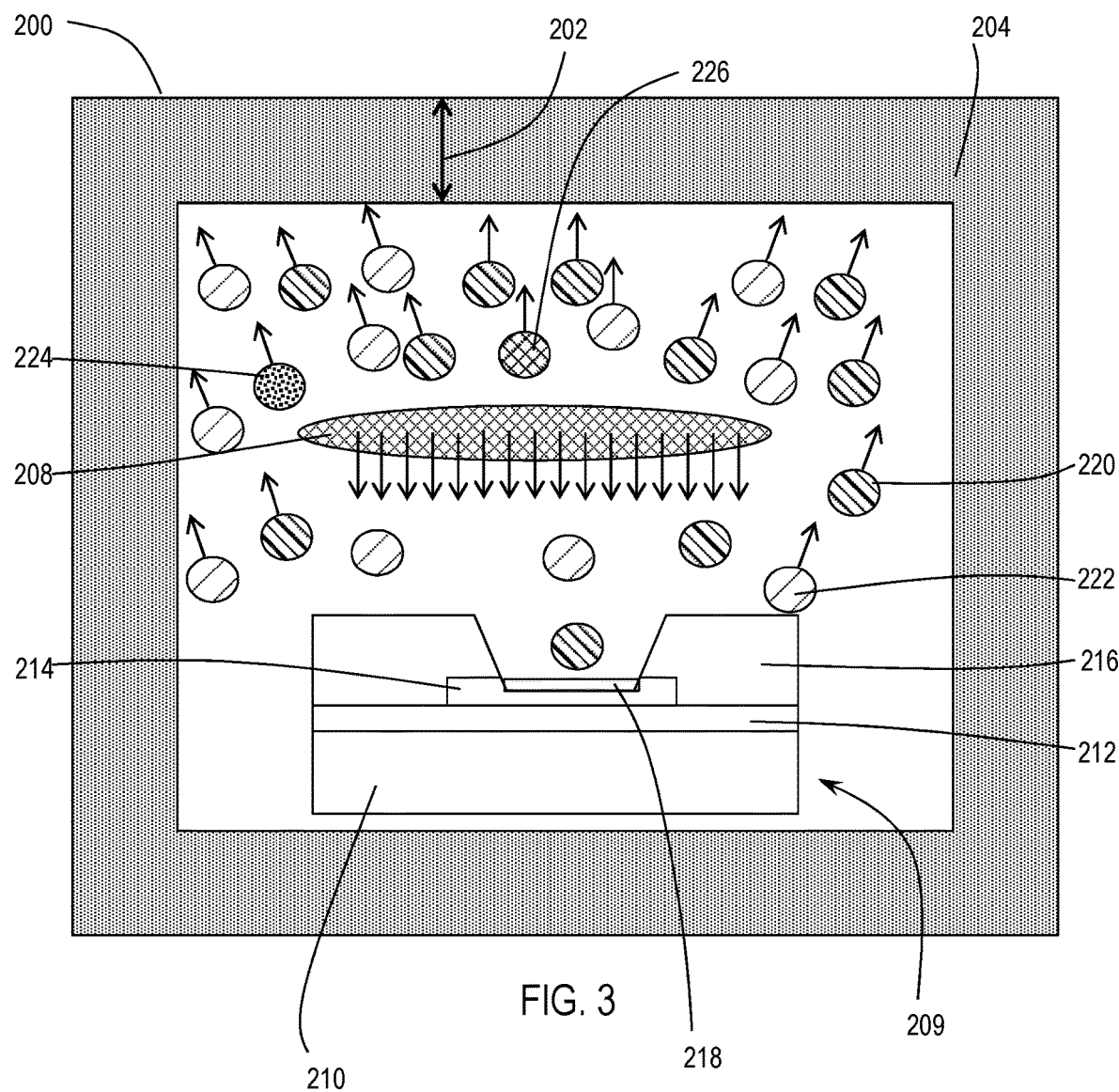
FIG. 3 depicts a processing chamber in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

Tremendous efforts have been devoted to reduce the outgassing of polymers during under bump metallization (UBM), such as temperature control and RF power tuning, etc. In one or more embodiments, covering the inner shield or walls of a processing chamber with one or more of titanium (Ti), barium (Ba), or cerium (Ce) through a pasting method helps to absorb outgassing molecules. As used herein, the term "pasting" refers to sputtering of a getter material such that the material adheres to the walls of a processing chamber, forming a layer of the getter material on the walls.

In one or more embodiments, the concentration of outgassing molecules in the processing chamber can advantageously be significantly reduced. Accordingly, in one or more embodiments, the recontamination of the metal contact surface is minimized, helping to keep low contact resistance for better electronic device performance.

Embodiments of the disclosure provide shutter disks comprising one or more of titanium (Ti), barium (Ba), or cerium (Ce) for physical vapor deposition (PVD) that allows pasting to minimize outgassing and control defects during etching of substrate. One or more embodiments provide improved and/or increased useful lifetime of the process kit.

In one or more embodiments, it has been observed that pasting a getter material on/in a processing chamber, e.g. a pre-clean chamber, decreases the outgassing molecule concentration by at least two orders of magnitude. The observed results are superior to other methods, such as increasing pumping speed and improved gas conductance.

Embodiments of the disclosure incorporate getter materials that are highly selective to reactive gas molecules, such as oxygen ($O_2$), carbon monoxide (CO), carbon dioxide ($CO_2$), and water ($H_2O$). These reactive gas molecules can be detrimental to metal contact resistance in PVD deposited devices. Some embodiments advantageously provide titanium (Ti), barium (Ba), or cerium (Ce) shutter disks that minimize shield outgassing, extends shield kit life, prevents recontamination to metal surfaces, acts as getter materials, absorbs outgassing molecules including oxygen ($O_2$), carbon monoxide (CO), carbon dioxide ($CO_2$), and water ($H_2O$) during processing, are capable of withstanding high temperature, and/or have minimum warpage during processing.

Embodiments of the disclosure do not need chamber hardware modification, but instead utilize a shutter disk containing or comprising a getter material. In one or more embodiments, the shutter disk is transferred to the processing chamber and RF power is used to perform a sputtering process, sputtering the getter material on the sides of the processing chamber. In one or more embodiments, the shutter disk is insensitive to inert gas molecules such as argon (Ar) and helium (He), and, therefore, inert gas molecules have limited impact on the physical plasma sputtering effect in the pre-clean process.

With reference to FIGS. 1-4, one or more embodiments are directed to a method 100 of processing a substrate. The method illustrated in FIG. 1 is representative of a physical vapor deposition (PVD) process. As used herein, the terms "physical vapor deposition" or, alternatively, "sputtering" refer to a process for deposition of metals and related materials in the fabrication of semiconductor integrated circuits. Use of sputtering has been extended to depositing metal layers onto the sidewalls of high aspect-ratio holes such as vias or other vertical interconnect structures. Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. An inert gas, argon (Ar) for example, is admitted to the chamber. When a negative DC bias of several hundred volts is applied to the target while the chamber walls or shields remain grounded, the inert gas is excited into a plasma. The positively charged inert gas ions are attracted to the negatively biased target at high energy and sputter target atoms from the target.

In one or more embodiments, at operation 10, a getter material 204 is deposited on at least one wall of a processing chamber 200. In one or more embodiments, the getter material 204 is deposited to a thickness 202 on the at least one wall of the processing chamber 200. In one or more embodiments, the thickness 202 is greater than or equal to 10 nm, including a range of about 10 nm to about 100 µM. In one or more embodiments, the getter material 206 comprises one or more of titanium (Ti), barium (Ba), or cerium (Ce). In one or more embodiments, the getter material 204 is obtained by sputtering a shutter disk 206. In one or more embodiments the sputtering process comprises exposing the shutter disk 206 to a plasma 208. In one or more embodiments, the plasma 208 comprises an inert plasma. In some embodiments, the plasma 208 comprises one or more of argon (Ar) or helium (He).

In one or more embodiments, the plasma 208 may be generated remotely or within the processing chamber 200. In one or more embodiments, the plasma 208 is an inductively coupled plasma (ICP) or a conductively coupled plasma (CCP). Any suitable power can be used depending on, for example, the reactants, or the other process conditions. In some embodiments, the plasma 208 is generated with a plasma power in the range of about 10 W to about 3000 W. In some embodiments, the plasma 208 is generated with a plasma power less than or equal to about 3000 W, less than or equal to about 2000 W, less than or equal to about 1000 W, less than or equal to about 500 W, or less than or equal to about 250 W.

In one or more embodiments, the shutter disk 206 comprises one or more of titanium (Ti), barium (Ba), or cerium (Ce). In a specific embodiment, the shutter disk 206 comprises titanium (Ti), and, upon sputtering, releases a getter material 204 comprising titanium (Ti) such that titanium is deposited on at least one wall of the processing chamber 200.

In one or more embodiments, at operation 20, the shutter disk 206 is then moved or transferred to a buffer station. In some embodiments, the buffer station is located within the processing chamber 200. In other embodiments, the buffer station is located in an adjacent chamber. In one or more embodiments, the shutter disk 206 is transferred by a robot. In one or more embodiments, at operation 30, a substrate 209 is then positioned within the processing chamber 200.

In one or more embodiments, the substrate 209 comprises one or more of a silicon layer 210, an oxide layer 212, a metal layer 214, a polymer layer 216, or a native oxide layer 218. In one or more embodiments, the oxide layer 212 comprises an aluminum oxide layer. In one or more embodiments, the metal layer 214 comprises one or more of aluminum (Al) or copper (Cu). In one or more embodiments, the polymer layer 216 comprises one or more of polyimide or polybenzoxazole.

In one or more embodiments, at operation 40, the substrate 209 is etched in the processing chamber 200. In one or more embodiments, the substrate 209 is etched by a plasma 208. In one or more embodiments, the plasma 208 comprises an inert plasma. In some embodiments, the plasma 208 comprises one or more of argon (Ar) or helium (He). In some embodiments, the plasma 208 is the same as the plasma used to sputter the getter material 204 on at least one side wall of the processing chamber. In other embodiments, the plasma 208 is different than the plasma that is used to sputter the getter material 204.

Figure 4:
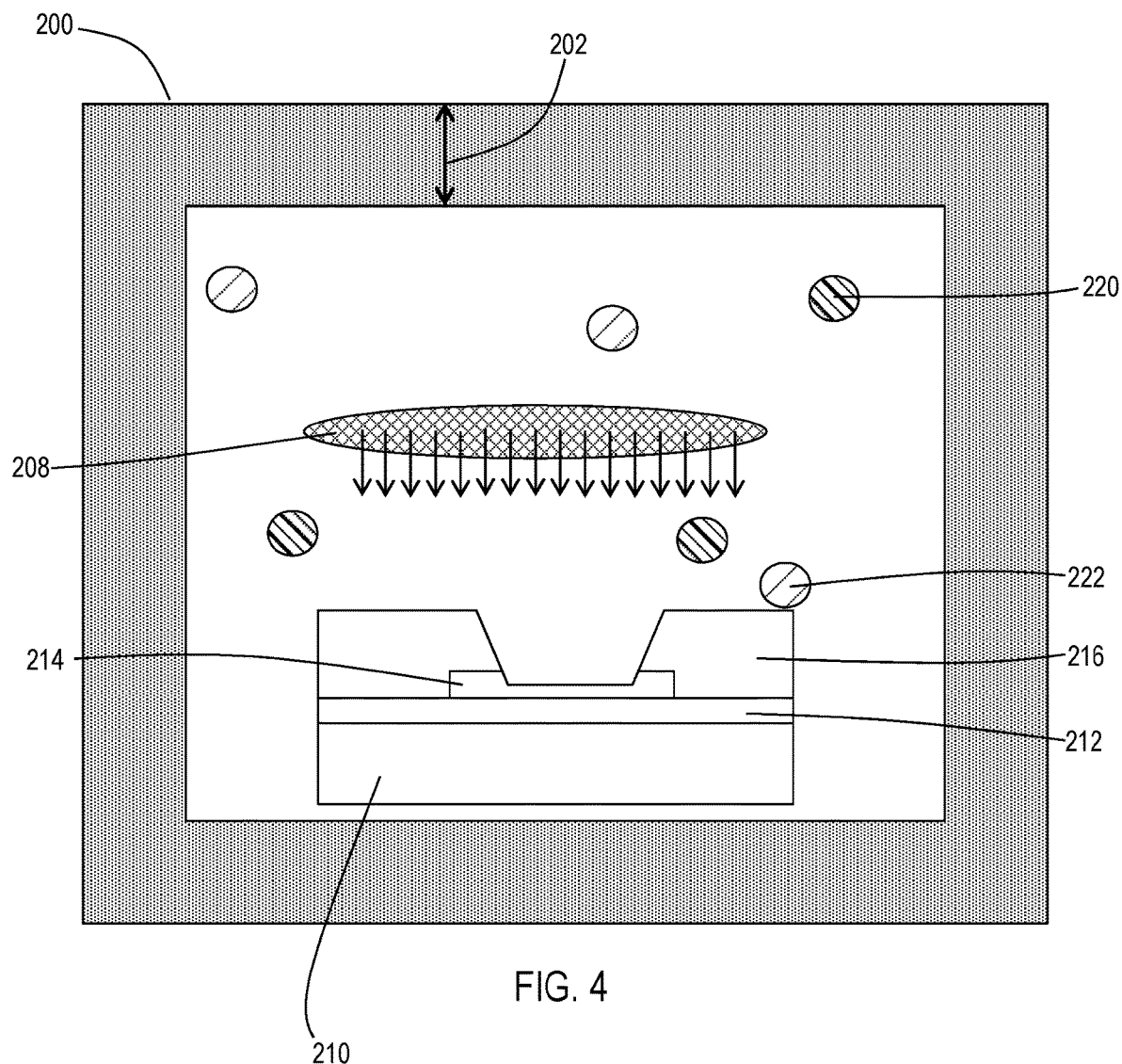
FIG. 4 depicts a processing chamber in accordance with one or more embodiments.

Without intending to be bound by theory, upon etching of the polymer layer 216 of the substrate 209, the substrate 209 releases outgassing molecules, for example 220, 222, 224, 226. In one or more embodiments, the outgassing molecules are absorbed by the getter material 204 which was deposited on the sides of the processing chamber 200. In one or more embodiments, the outgassing molecules comprise one or more of oxygen ($O_2$), carbon monoxide (CO), carbon dioxide ($CO_2$) or water ($H_2O$). As illustrated in FIG. 4, because the getter material is able to absorb the outgassing molecules, the concentration of outgassing molecules in the processing chamber is significantly reduced, and, therefore, the recontamination to the metal contact surface 214 of the substrate 209 is minimized so as to keep low contact resistance for better electronic device performance.

In one or more embodiments, the amount of outgassing molecules from the substrate 209 is reduced to less than or equal to about 10% of the outgassing molecules from a substrate in the processing chamber that does not contain the getter material. In one or more specific embodiments, the amount of outgassing carbon monoxide (CO) from the substrate 209 is reduced to less than or equal to about 10% of the outgassing carbon monoxide (CO) from a substrate in the processing chamber that does not contain the getter material.

Figure 5:
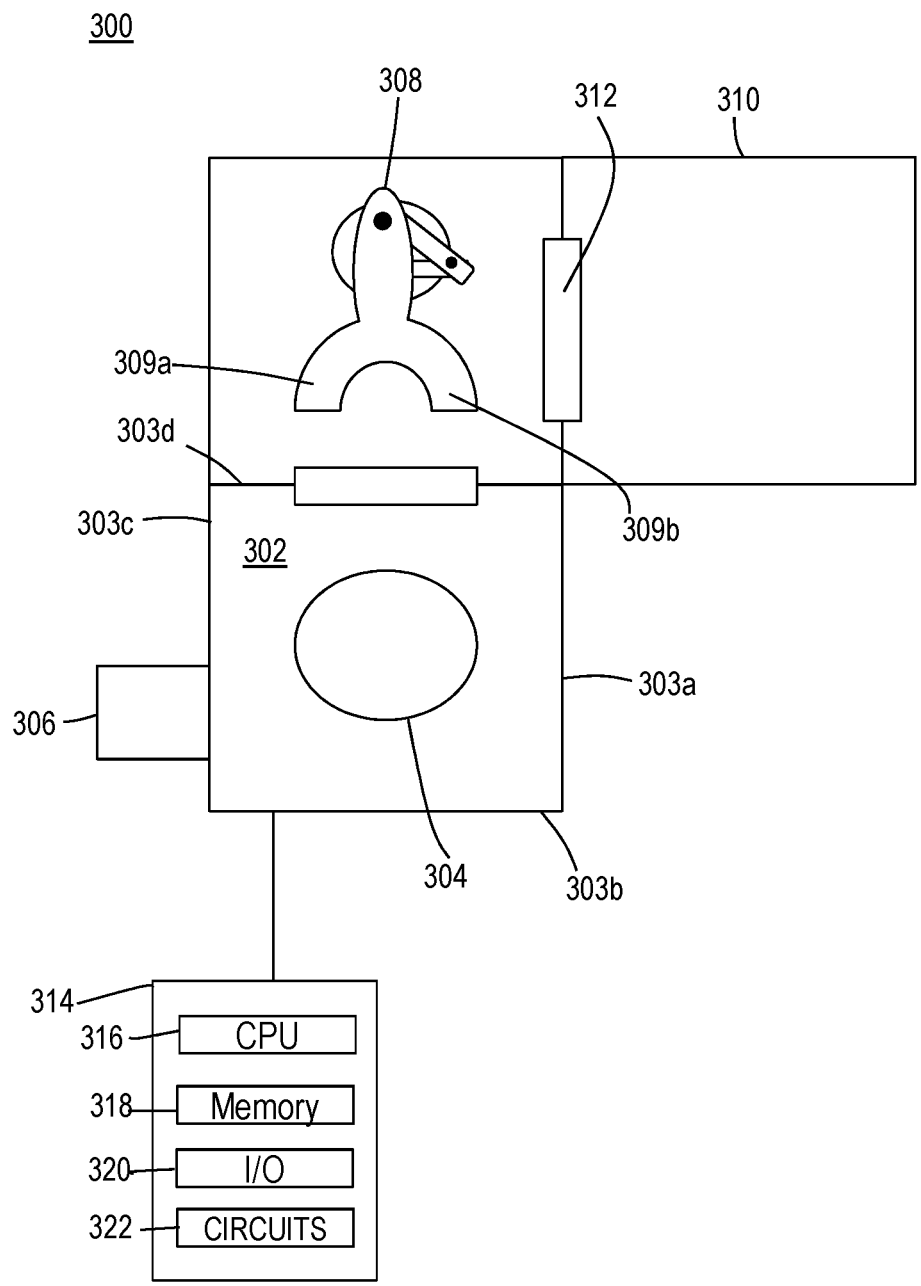
FIG. 5 depicts a processing tool in accordance with one or more embodiments.

FIG. 5 shows a processing tool 300 in accordance with one or more embodiments of the disclosure. The embodiment shown in FIG. 5 is merely representative of one possible configuration and should not be taken as limiting the scope of the disclosure. For example, in some embodiments, the processing tool 300 has a different numbers of one or more of the processing chambers 302, buffer stations 310 and/or robot 308 configurations than the illustrated embodiment.

The exemplary processing tool 300 includes a processing chamber 302, e.g. pre-clean chamber, which has a plurality of sides. The processing chamber 302 shown has a first side 303a, a second side 303b, a third side 303c, and a fourth side 303d. Although four sides are shown, those skilled in the art will understand that there can be any suitable number of sides to the processing chamber 302 depending on, for example, the overall configuration of the processing tool 300. In some embodiments, there the processing chamber 302 has three sides, four sides, five sides, six sides, seven sides or eight sides.

The processing chamber 302 has a robot 308 positioned therein. The robot 308 can be any suitable robot capable of moving a wafer during processing. In some embodiments, the robot 308 has a first arm 309a and a second arm 309b. The first arm 309a and second arm 309b can be moved independently of the other arm. The first arm 309a and second arm 309b can move in the x-y plane and/or along the z-axis. In some embodiments, the robot 308 includes a third arm (not shown) or a fourth arm (not shown). Each of the arms can move independently of other arms.

The processing tool 300 can also include one or more buffer station 310 connected to the first side 303a of the processing chamber 302. The buffer stations 310 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing tool 300 may also include one or more slit valves 312 between the processing chamber 302 and the buffer station 310. The slit valves 312 can open and close to isolate the interior volume within the processing chamber 302. For example, if the processing chamber 302 will generate plasma during processing, it may be helpful to close the slit valve for that processing chamber to prevent stray plasma from damaging the robot in the transfer station.

A robot 308 can be used to move the wafers or cassettes into and out of the buffer stations 310. The wafers or cassettes can be moved within the processing tool 300 by the robot 308. In one or more embodiments, the robot 308 moves the shutter disk into and out of the processing chamber 302 to the buffer station 310.

A controller 314 may be provided and coupled to various components of the processing tool 300 to control the operation thereof. The controller 314 can be a single controller that controls the entire processing tool 300, or multiple controllers that control individual portions of the processing tool 300. For example, the processing tool 300 may include separate controllers for each of the processing chambers 302, buffer station 310, and robots 308.

In some embodiments, the processing chamber 302 further comprises a controller 314 connected to the plurality of substantially coplanar support surfaces 304. In one or more embodiments, the controller 314 controls a movement speed of the substrate support assembly 304.

In some embodiments, the controller 314 includes a central processing unit (CPU) 316, a memory 318, input/outputs (I/O) 320, and support circuits 322. The controller 314 may control the processing tool 300 directly, or via computers (or controllers) associated with particular process chamber and/or support system components.

The controller 314 may be one of any form of general-purpose computer processor that can be used in an industrial setting for controlling various chambers and sub-processors. The memory 318 or computer readable medium of the controller 314 may be one or more of readily available memory such as random access memory (RAM), read only memory (ROM), floppy disk, hard disk, optical storage media (e.g., compact disc or digital video disc), flash drive, or any other form of digital storage, local or remote. The memory 318 can retain an instruction set that is operable by the processor (CPU 316) to control parameters and components of the processing tool 300.

The support circuits 322 are coupled to the CPU 316 for supporting the processor in a conventional manner. These circuits include cache, power supplies, clock circuits, input/output circuitry and subsystems, and the like. One or more processes may be stored in the memory 318 as software routine that, when executed or invoked by the processor, causes the processor to control the operation of the processing tool 300 or individual processing chambers in the manner described herein. The software routine may also be stored and/or executed by a second CPU (not shown) that is remotely located from the hardware being controlled by the CPU 316.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 314 has one or more configurations to execute individual processes or sub-processes to perform the method. The controller 314 can be connected to and configured to operate intermediate components to perform the functions of the methods. For example, the controller 314 can be connected to and configured to control one or more of gas valves, actuators, motors, slit valves, vacuum control or other components.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method, the method comprising:
transferring a shutter disk to a processing chamber, the shutter disk comprising a getter material;
sputtering the shutter disk to deposit a thickness of the getter material on walls of the processing chamber;
etching a substrate with a plasma in the processing chamber to remove native oxides and form a cleaned substrate, wherein etching the substrate releases outgassing molecules which are chemically bound to the getter material; and
optionally, removing the shutter disk from the processing chamber.

2. The method of claim 1, further comprising depositing a barrier layer on the cleaned substrate.

3. The method of claim 2, wherein the barrier layer comprises one or more of titanium (Ti) or copper (Cu).

4. The method of claim 1, wherein the getter material comprises one or more of titanium, barium or cerium.

5. The method of claim 1, wherein the sputtering process comprises exposing the shutter disk to a plasma.

6. The method of claim 5, wherein the shutter disk comprises one or more of titanium, barium or cerium.

7. The method of claim 1, further comprising moving the shutter disk to a buffer station and positioning the substrate in the processing chamber.

8. The method of claim 1, wherein the outgassing molecules comprise one or more of oxygen ($O_2$), carbon monoxide (CO), carbon dioxide ($CO_2$) or water ($H_2O$).

9. The method of claim 1, wherein the thickness of the getter material is greater than or equal to about 10 nm.

10. The method of claim 1, wherein the plasma comprises one or more of argon (Ar) or helium (He).

11. The method of claim 1, wherein the substrate comprises one or more of aluminum (Al), copper (Cu), an oxide layer or a polymer layer.

12. The method of claim 1, wherein an amount of CO outgassing from the substrate is reduced to less than or equal to about 10% of the CO outgassing from a substrate in a processing chamber without the getter material.

* * * * *